United States Patent
Wang et al.

(10) Patent No.: US 10,439,621 B1
(45) Date of Patent: Oct. 8, 2019

(54) TWO-STEP SWITCHING METHOD FOR A CIRCUIT SWITCH

(71) Applicant: NATIONAL CHIAO TUNG UNIVERSITY, Hsinchu (TW)

(72) Inventors: Shih-Hsing Wang, Hsinchu (TW); Chung-Chih Hung, Tainan County (TW)

(73) Assignee: National Chiao Tung University, Hsinchu (TW)

( * ) Notice: Subject to any disclaimer, the term of this patent is extended or adjusted under 35 U.S.C. 154(b) by 0 days.

(21) Appl. No.: 16/188,719

(22) Filed: Nov. 13, 2018

(30) Foreign Application Priority Data

Oct. 5, 2018 (TW) .............................. 107135185 A (51) Int. Cl.
*H03L 7/089* (2006.01)
*H03L 7/18* (2006.01)

(52) U.S. Cl.
CPC .............. *H03L 7/0896* (2013.01); *H03L 7/18* (2013.01)

(58) Field of Classification Search
CPC ............ H03L 7/0896; H03L 7/16; H03L 7/18
USPC ........ 327/365, 379, 384, 389, 391, 403, 404
See application file for complete search history.

(56) References Cited

U.S. PATENT DOCUMENTS

| | | | |
|---|---|---|---|
| 4,675,561 A * | 6/1987 | Bowers | H01L 27/0218 257/378 |
| 5,625,306 A * | 4/1997 | Tada | H03K 17/667 327/112 |
| 6,100,738 A * | 8/2000 | Illegems | H03K 17/687 327/103 |
| 6,642,759 B1 | 11/2003 | Hughes | |
| 6,717,446 B1 | 4/2004 | Vu | |
| 7,075,348 B2 | 7/2006 | Hsu et al. | |
| 8,040,168 B2 | 10/2011 | Sakiyama et al. | |
| 8,368,443 B1 * | 2/2013 | Su | H03L 7/0896 327/147 |
| 9,419,632 B1 | 8/2016 | Lee | |
| 9,502,970 B2 | 11/2016 | Zhu et al. | |

OTHER PUBLICATIONS

Communication From Taiwan Patent Office Regarding a Corresponding Foreign Application dated (Taiwan Year 108) Jan. 11, 2019.
Khalil Arshak, Omar Abubaker, Essa Jafer; Improved Charge Pump for Reduced Clock Feed Through and Charge Sharing Suppression; Proceedings of the Fifth IEEE International Caracas Conference on Devices, Circuits and Systems, Dominican Republic, Nov. 3-5, 2004, pp. 192-194.

* cited by examiner

*Primary Examiner* — William Hernandez
(74) *Attorney, Agent, or Firm* — Rosenberg, Klein & Lee (57) ABSTRACT

A two-step switching method of circuit switch can be used in a charge pump circuit of a phase locked loop circuit. In the method, a first type switch and a second type switch which have the same sizes and are opposite in type, are provided. The first type switch and second type switch continuously receive an input current, and the input current is kept at a low current state in a first stage before the first type switch and the second type switch are turned on. In a second stage, the first type switch and the second type switch are turned on, the input current is gradually adjusted to a target current state, and the input current of the target current state is gradually supplied to an external circuit. The present method can reduce noise generated by the external circuit, reduce power loss, and offset charge injection.

9 Claims, 9 Drawing Sheets

TWO-STEP SWITCHING METHOD FOR A CIRCUIT SWITCH

This application claims priority for Taiwan patent application no. 107135185 filed on Oct. 5, 2018, the content of which is incorporated by reference in its entirety.

BACKGROUND OF THE INVENTION

1. Field of the Invention

The present invention relates to a switching method of a circuit, more particularly to a two-step switching method applied to a circuit switch of a charge pump circuit of a phase locked loop circuit.

2. Description of the Related Art

A phase locked loop circuit applies feedback control principle to implement frequency and phase synchronization. An output clock of the phase locked loop circuit is synchronized with an external reference clock, and when the frequency or phase of the reference clock is changed, the phase locked loop circuit can detect the change and regulate the frequency of the output clock thereof through feedback devices thereof until the output clock is synchronized with the external reference clock again. This synchronization method is also called as a phase-locked method.

Figure 1:
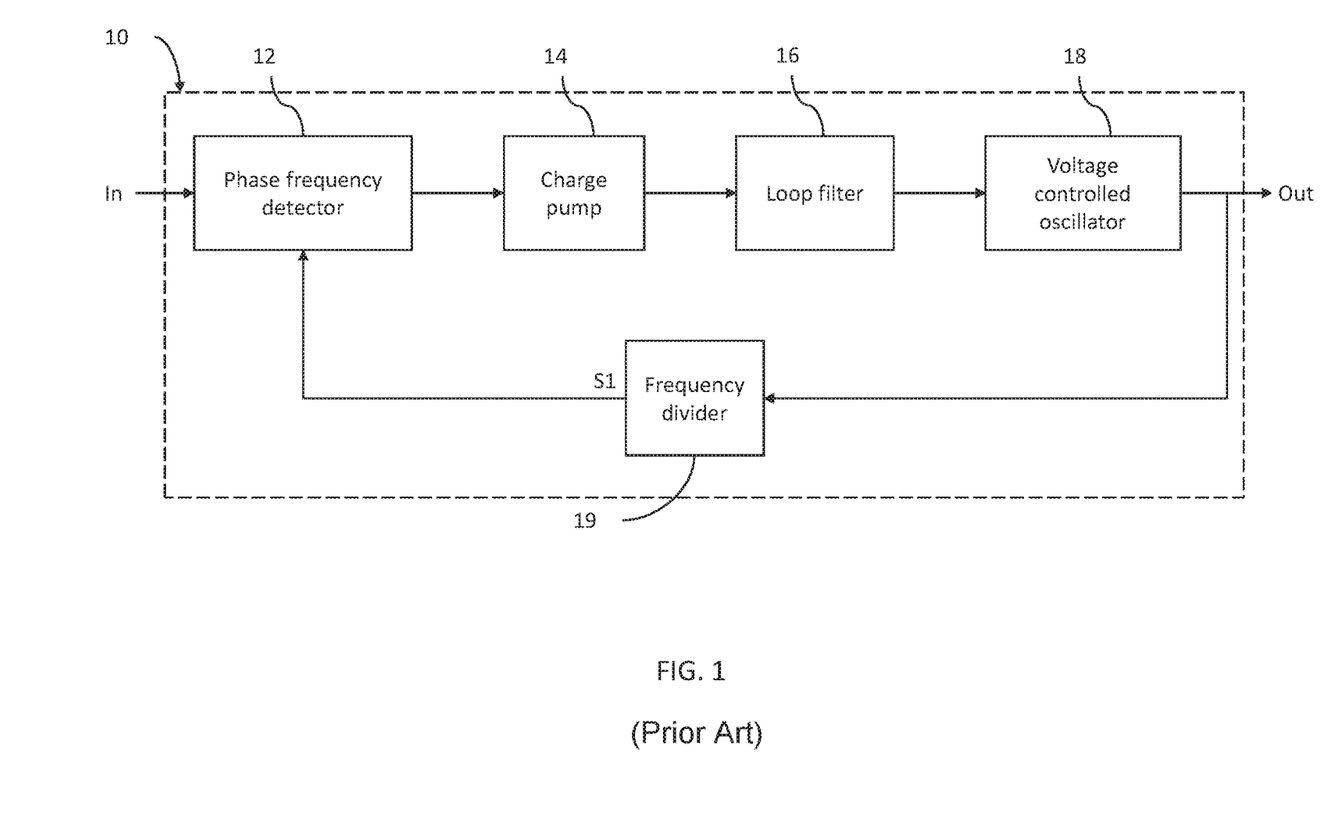
FIG. 1 is a block diagram of a conventional phase locked loop circuit.

Please refer to FIG. 1. A conventional phase locked loop circuit 10 includes a phase frequency detector 12, a charge pump 14, a loop filter 16, a voltage controlled oscillator 18 and a frequency divider 19. The phase locked loop circuit 10 uses the phase frequency detector 12 to compare a phase difference between an external input reference signal In and a signal S1 outputted from the frequency divider 19, and then generate an output voltage, proportional to the phase difference, to control switching operation of the charge pump 14 to output current for charging or discharging the loop filter 16. The loop filter 16 can filter out high-frequency component of the current, to form a DC voltage as a control voltage of the voltage controlled oscillator 18, so that the frequency of the output signal Out of the voltage controlled oscillator 18 can be adjusted by the control voltage.

However, the charge pump 14 of the conventional phase locked loop circuit 10 mainly uses a constant current source to quickly charge or discharge the loop filter, and use a switch current source to charge or discharge a capacitor of the charge pump. When outputting a signal High at an upper current source, the phase frequency detector 12 correspondingly outputs a signal Low at a lower current source, so as to turn on or off the switch current source, to charge the loop filter through the charge pump, thereby performing the filtering operation; otherwise, when outputting the signal Low at the upper current source, the phase frequency detector 12 correspondingly outputs the signal High at the lower current source, so as to perform the discharging operation and filtering operation.

In actual application, since the charge pump continuously receives current from the constant current source, the leakage current occurs easily even when the switch is turn off, and it causes non-necessary energy loss and less power efficiency; furthermore, when the switch is turned on, the injected current causes transient response on the loop filter, resulting in obvious oscillation phenomenon.

In order to preventing the loop filter from being affected when the charge pump of the phase locked loop circuit is switched, the present invention provides a two-step switching method of circuit switch.

SUMMARY OF THE INVENTION

An objective of the present invention is to provide a two-step switching method of a circuit switch which uses a two-step switching technology to effectively reduce switch noise such as clock feedthrough from the charge pump to the loop filter and charge injection noise, thereby reducing oscillation phenomenon and saving power.

Another objective of the present invention is to provide a two-step switching method of a circuit switch, to control the current injection of the charge pump for achieving higher power efficiency without affecting the existing circuit elements; furthermore, two-step switching method can also prevent from using additional circuit element, so as to save circuit cost.

In order to achieve above-mentioned objectives, the present invention provides a two-step switching method of circuit switch. The two-step switching method can be applied to a charge pump circuit of a phase locked loop, and includes steps of providing a first type switch and a second type switch which have the same sizes and are opposite in type, wherein the first type switch and the second type switch continuously receive an input current; in a first stage, keeping the input current in a low current state before the first type switch and the second type switch are turned on; and in a second stage, turning on the first type switch and the second type switch, and gradually adjusting the input current to a target current state to an external circuit; wherein the step of keeping the input current in the low current state in the first stage and gradually adjusting the input current to the target current state in the second stage reduces noise generated in the external circuit; wherein the step of keeping the input current in the low current state can both reduce unnecessary power loss on current mirror and cancel the charge injection to the loop filter.

In an embodiment, the first type switch includes a first drain, a first gate, a first source and a first channel, and the first channel is electrically connected to the first drain, the first gate and the first source, wherein the second type switch comprises a second drain, a second gate, a second source and a second channel, the second channel is electrically connected to the second drain, the second gate and the second source, wherein the second drain and the first source are connected to the same node for receiving the input current, wherein the second source, the first drain and the external circuit are connected to the same node.

In an embodiment, when the first type switch is a P-type transistor switch, the second type switch is a N-type transistor switch; alternatively, when the first type switch is the N-type transistor switch, the second type switch is the P-type transistor switch, and the N-type transistor switch is turned on when a gate voltage of the N-type transistor switch is adjusted from 0 volt to an operation voltage, and the P-type transistor switch is turned on when a gate voltage of the P-type transistor switch is adjusted from the operation voltage to 0 volt.

In an embodiment, the first type switch and the second type switch have the same channel lengths or the same gate lengths, and have the same channel widths.

In an embodiment, the input current in the low current state is 0.4 µA, and the input current in the target current state is 20 µA.

In an embodiment, the input current is from a current mirror.

In an embodiment, the external circuit is a loop filter.

In an embodiment, the loop filter is an off-chip loop filter.

BRIEF DESCRIPTION OF THE DRAWINGS

The structure, operating principle and effects of the present invention will be described in detail by way of various embodiments which are illustrated in the accompanying drawings.

DETAILED DESCRIPTION OF THE PREFERRED EMBODIMENTS

The following embodiments of the present invention are herein described in detail with reference to the accompanying drawings. These drawings show specific examples of the embodiments of the present invention. It is to be understood that these embodiments are exemplary implementations and are not to be construed as limiting the scope of the present invention in any way. Further modifications to the disclosed embodiments, as well as other embodiments, are also included within the scope of the appended claims. These embodiments are provided so that this disclosure is thorough and complete, and fully conveys the inventive concept to those skilled in the art. Regarding the drawings, the relative proportions and ratios of elements in the drawings may be exaggerated or diminished in size for the sake of clarity and convenience. Such arbitrary proportions are only illustrative and not limiting in any way. The same reference numbers are used in the drawings and description to refer to the same or like parts.

It is to be understood that although the terms 'first', 'second', 'third', and so on, may be used herein to describe various elements, these elements should not be limited by these terms. These terms are used only for the purpose of distinguishing one component from another component. Thus, a first element discussed herein could be termed a second element without altering the description of the present disclosure. As used herein, the term "or" includes any and all combinations of one or more of the associated listed items.

It will be understood that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present.

In addition, unless explicitly described to the contrary, the word "comprise" and variations such as "comprises" or "comprising", will be understood to imply the inclusion of stated elements but not the exclusion of any other elements.

The present invention can reduce nonideal effect caused by the charge pump circuit of the phase locked loop, for example, feedthrough and charge injection during operations of switching clock. The nonideal effect possibly causes jitter of the output clock of the phase locked loop circuit. The two-step switching method of the present invention can alleviate the nonideal effect by controlling switches and current charging signal, thereby reducing current of the charge pump circuit for low power consumption.

Figure 2:
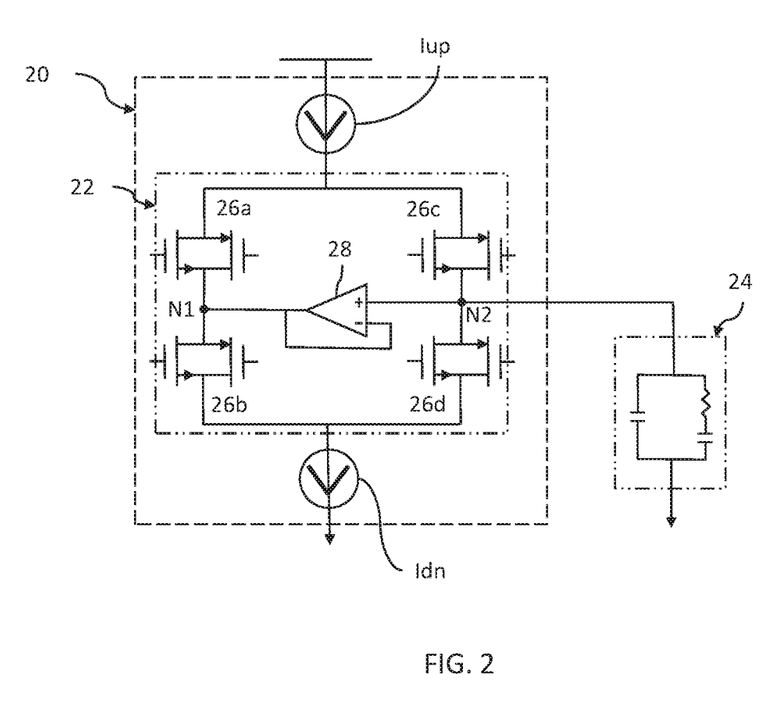
FIG. 2 is a circuit architecture diagram of a charge pump circuit applying the two-step switching method of the present invention.

Please refer to FIG. 2, which shows a current pump circuit 20 of a phase locked loop circuit. As shown in FIG. 2, the current pump circuit 20 includes a first current source Iup, a current pump 22 and a second current source Idn which are electrically connected in series. The current pump 22 is also electrically connected to an output, such as an external circuit 24. In this embodiment, the external circuit 24 can be a loop filter. The current pump 22 can include four circuit switch sets 26a, 26b, 26c, and 26d which are electrically connected to form a loop. An amplifier set 28 is electrically connected between a node N1 of the circuit switch sets 26a and 26b, and a node N2 of the circuit switch sets 26c and 26d.

Figure 3:
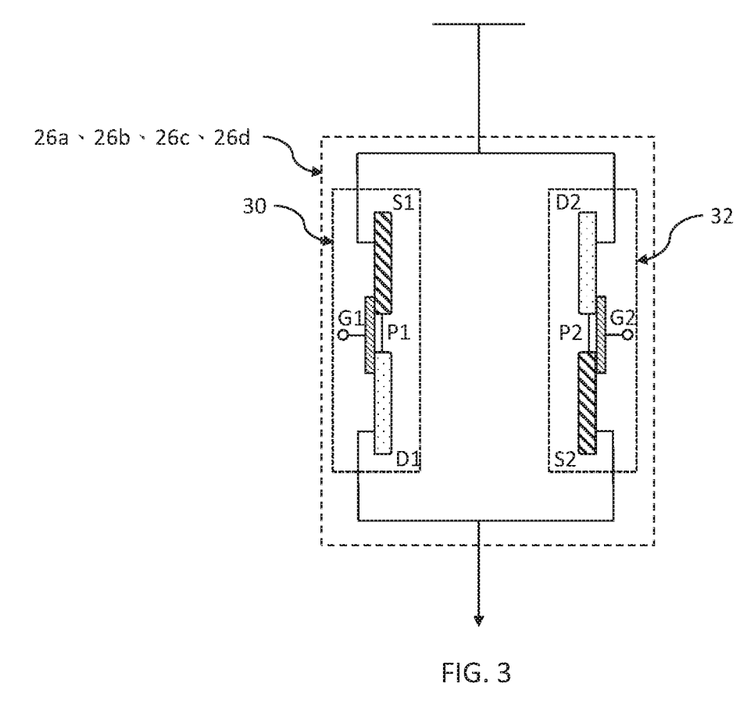
FIG. 3 is a circuit diagram of a circuit switch set of FIG. 2.

Please also refer to FIG. 3. Each of the circuit switch sets 26a, 26b, 26c, and 26d includes a first type switch 30 and a second type switch 32 electrically connected in parallel with each other, and the first type switch 30 and the second type switch 32 are opposite in type. For example, when the first type switch 30 is a P-type transistor switch, the second type switch 32 is the N-type transistor switch; alternatively, when the first type switch 30 is a N-type transistor switch, the second type switch 32 is the P-type transistor switch. In this embodiment, the first type switch 30 is P-type transistor and the second type switch 32 is the N-type transistor for exemplary illustration. The first type switch 30 includes a first drain D1, a first gate G1, a first source S1 and a first channel P1. The first channel P1 is electrically connected to the first drain D1, the first gate G1 and the first source S1. The second type switch 32 includes a second drain D2, a second gate G2, a second source S2 and a second channel P2. The second channel P2 is electrically connected to the second drain D2, the second gate G2 and the second source S2. The second drain D2 and the first source S1 electrically connected to the same node for receiving an input current from a source located outside the circuit switch sets 26a, 26b, 26c, and 26d, for example, the input current can be provided by the first current source Iup or the second current source Idn. The second source S2, and the first drain D1 and the output are electrically connected to the same node, and the output can be the external circuit 24. The first type switch 30 and the second type switch 32 have the same sizes, it indicates that the channel lengths or the gate lengths of the first type switch 30 and second type switch 32 are the same, and channel widths of the first type switch 30 and second type switch 32 are also the same.

Figure 4:
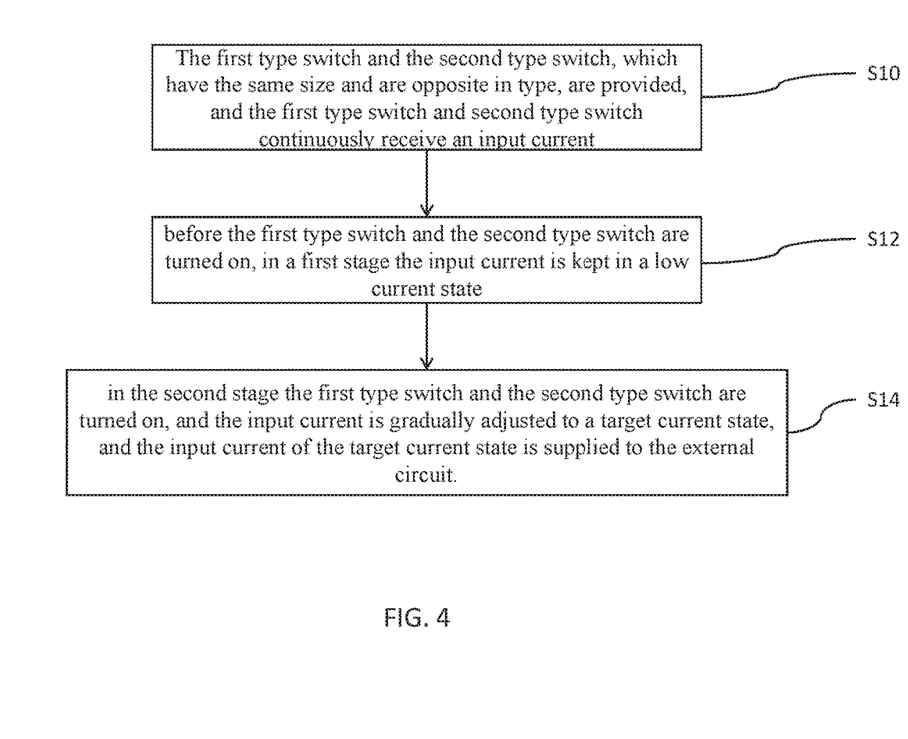
FIG. 4 is a flowchart showing the steps in an operation of the two-step switching method of the present invention.

After the illustration of the circuit structure of the present invention, the implementation for the two-step switching method of the circuit switch of the present invention is described below. Please refer to FIGS. 2 to 4. First, in a step S10, the first type switch 30 and the second type switch 32 shown in FIG. 2 are provided, and the first type switch 30 and second type switch 32 receive an input current, such as the current transmitted from the first current source Iup. In a step S12, before the first type switch 30 and the second type switch 32 are turned on, in a first stage the input current is kept in a low current state, for example, the amount of the input current is 0.4 µA. In step S14, in the second stage the first type switch 30 and the second type switch 32 are turned on. In this embodiment, since the first type switch 30 is the P-type transistor and the second type switch 32 is the N-type transistor, the first type switch 30 is turned on by adjusted the gate voltage at the first gate G1 from an operation voltage to a 0 volt, while the second type switch 32 is turned on by adjusting the gate voltage at the second gate G2 from a 0 volt to an operation voltage; as a result, the first type switch 30 and the second type switch 32 can be turned on at the same time, to gradually adjust the input current to a target current state, for example, the input current is gradually adjusted from 0.4 µA to 20 µA, so as to gradually output the current of the target current state to an external circuit 24. The current of the low current state of the present invention is lower than that of the target current state. It should be noted that the above-mentioned values are merely for illustration of embodiment, and the user can adjust the input current form the low current state to the desired target current state, according to different manufacturing process and requirement.

Figure 5:
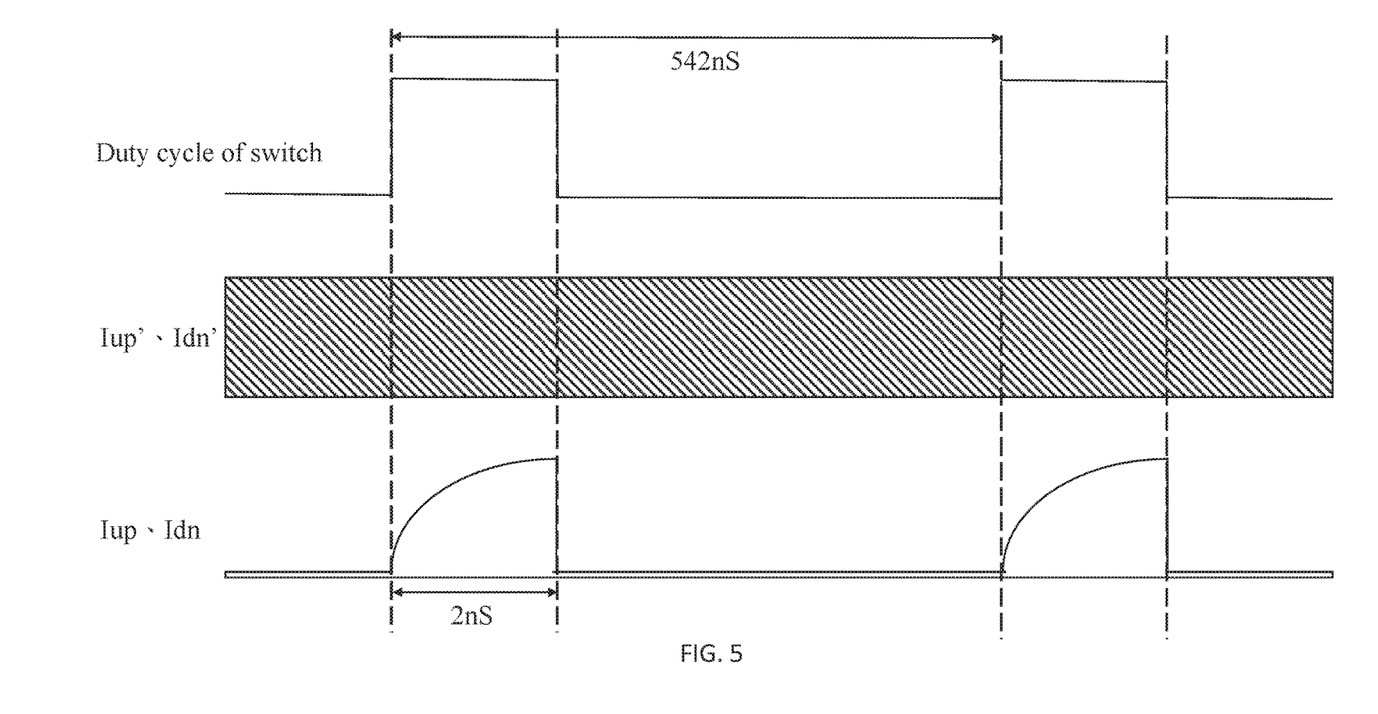
FIG. 5 is a schematic view of a comparison between current losses of the conventional method and the two-step switching of the present invention during duty cycle of switch.
Figure 6:
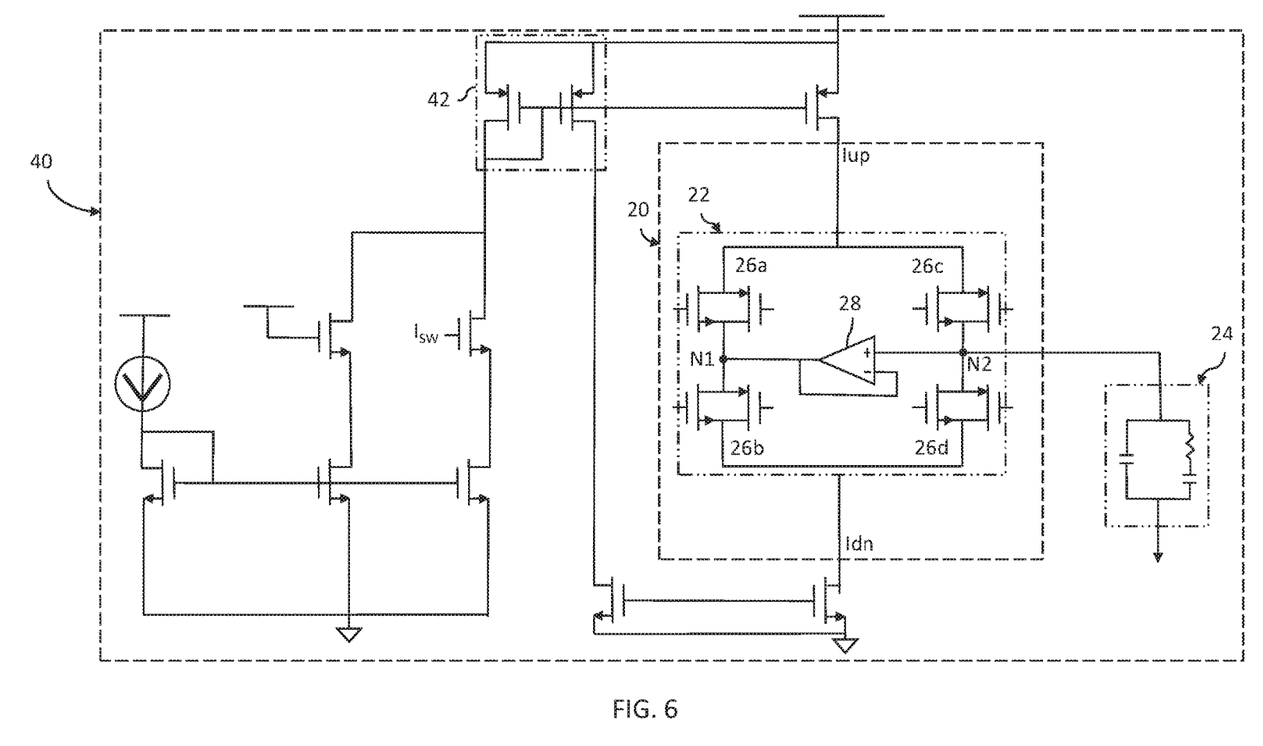
FIG. 6 is a circuit architecture which can apply the two-step switching method of the present invention.

After the operations of the two-step switching method (abbreviated as TSS method) is completed, the nonideal effect of the circuit can be effectively reduced and low power consumption can be achieved because the input current in the first stage is kept at the low current state. Please refer to FIG. 5. In the conventional circuit which does not use the two-step switching method of the present invention, the first current source Iup' and second current source Idn' keep injecting current; on the other hand, in the two-step switching method of the present invention, the input current is adjusted in the low current state in the first stage, and after the first type switch 30 and the second type switch 32 are turned on, the input current such as the input current of the first current source Iup and the second current source Idn, are gradually adjusted to the target current state. As shown in FIG. 5, compared with the conventional circuit without using the TSS method, the circuit using the TSS method of the present invention is more power-saving, and in actual operation, leakage current possibly occurs before the switches are turned on; however, since the input current is kept in low current state in the TSS method of the present invention before the switches are turned on, leakage current loss of the circuit using the TSS method of the present invention is much less than that of the conventional circuit. Furthermore, when the circuit switch turn-on time is 2 nanoseconds and a sum of working durations of the first stage and the second stage is 542 nanoseconds, such as the duration until the switches are turned on next time, the low current state in which the switches are turn off can save 99.6% of static power compared with the conventional circuit. In other embodiment, when the circuit device includes a plurality of current mirrors, the saved power consumption can increase in multiple. Please refer to FIG. 6. The two-step switching method can be applied to larger circuit architecture 40 using the current pump circuit 20 shown in FIG. 2. The current mirror 42 provides a constant current to current pump 22, and keeps the same current. The input current of the current pump 22 can be inputted from the current mirror 42. When the phase locked loop circuit is in a locked state, and can keep a current-tracking phase locked loop state in a short dead-zone. When the loop filter 24 does not charge or discharge, the TSS method of the present invention can reduce unnecessary current consumption compared with conventional technology, and just keep the low current state of the input current of the first current source Iup in the current mirror 42.

Figure 7:
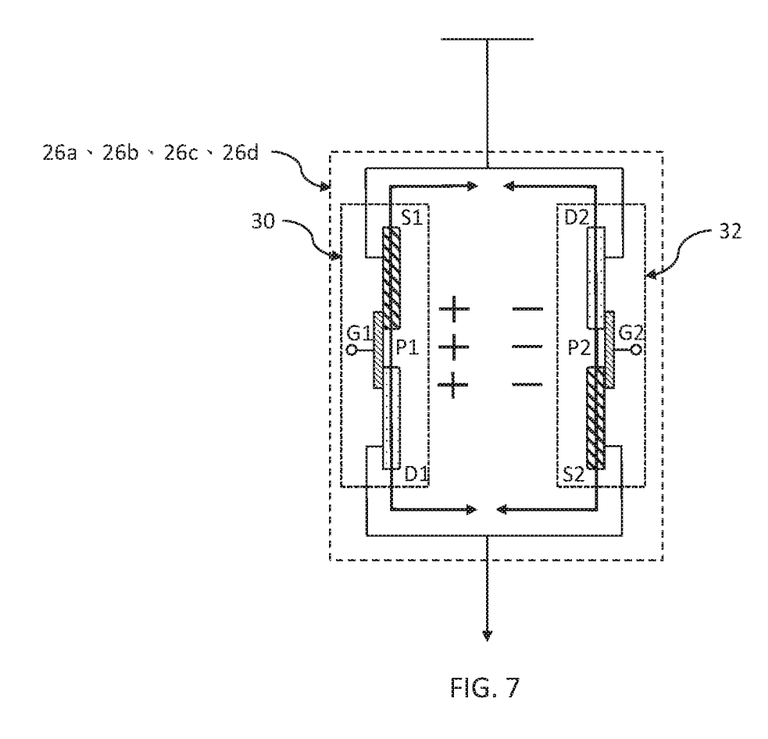
FIG. 7 is a schematic view of operation of charge injection cancellation, according to the present invention.

Please refer to FIG. 7. In regard to the charge injection effect formed by the first type switch 30 and the second type switch 32, when the channel charges are released to become a small current flowing into the first drain D1, the first source S1, the second drain D2, the second source S2, the current characteristic depends on whether the charge flowing through the first channel P1 and the second channel P2 is electron or hole. In this embodiment, the first type switch 30 and second type switch 32 have the same sizes, and the first channel P1 and the second channel P2 of the first type switch 30 and second type switch 32 are different in polarity, so the released charges from the first type switch 30 and the second type switch 32 can be cancelled each other.

Figure 8A:
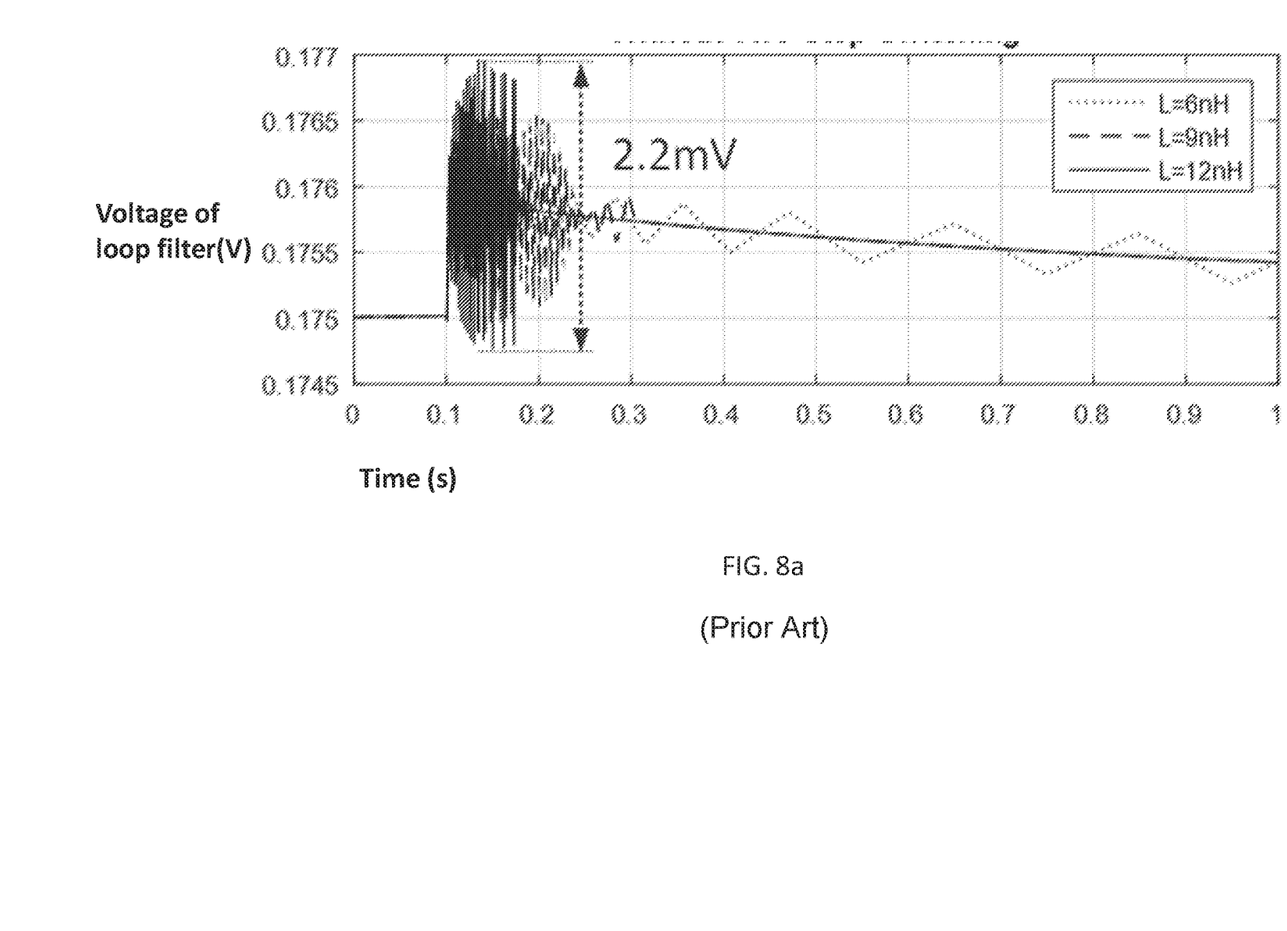
FIG. 8a is a transient response with oscillation phenomenon on output voltage of a conventional loop filter.
Figure 8B:
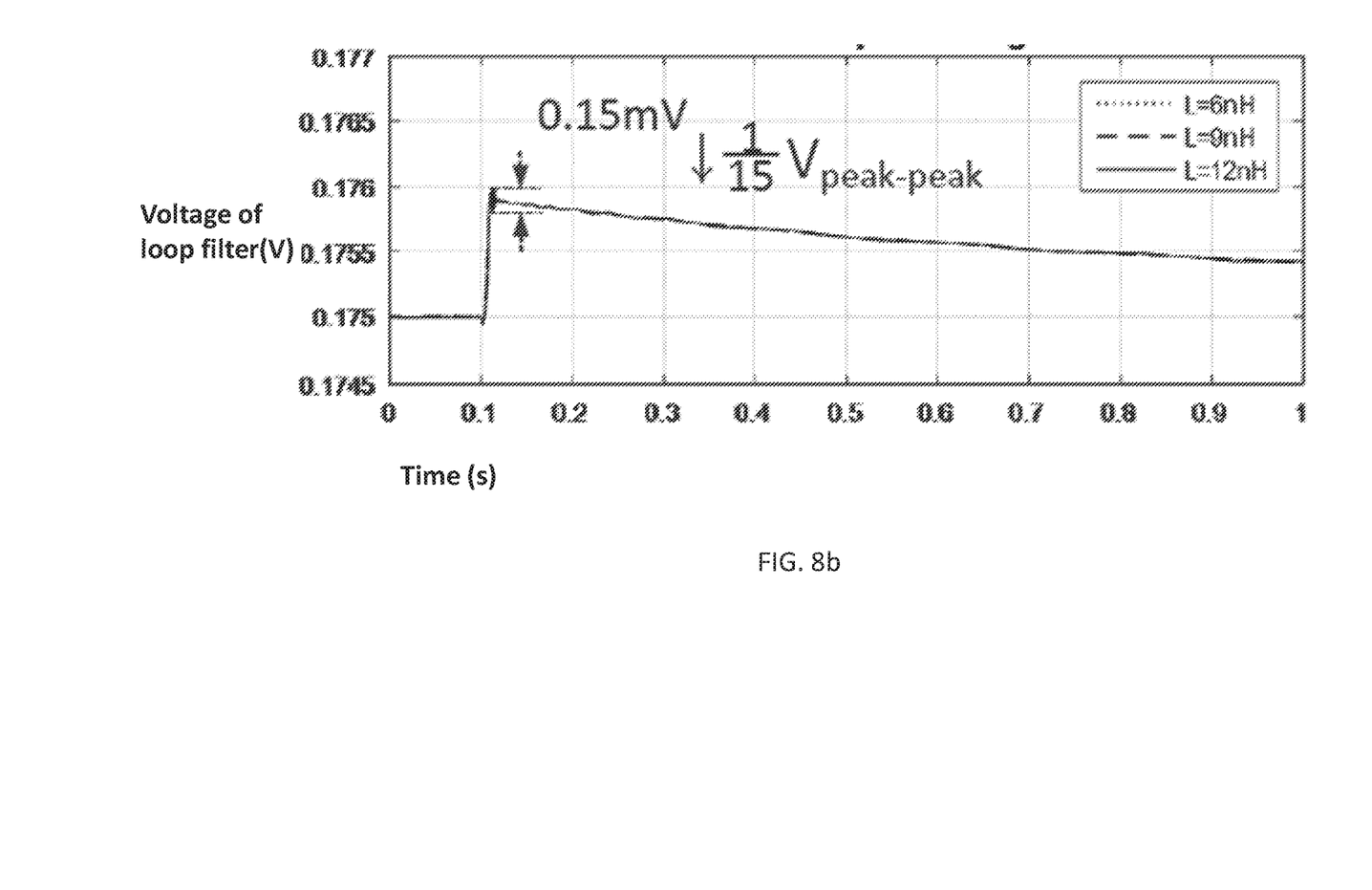
FIG. 8b is a transient response without oscillation phenomenon on output voltage of a loop filter using the two-step switching method of the present invention.

The two-step switching method of the present invention can reduce the power loss and transient bounce caused by the bonding wire and lead frame in the circuit, and cancel the charge injection, and also reduce the transient noise on the loop filter. Please refer to FIG. 8a and FIG. 8b. FIG. 8a shows transient response with ringing amplitude on the loop filter of conventional circuit without using the two-step switching method of the present invention, and FIG. 8b shows transient response without ringing amplitude on the loop filter of the circuit, which has the same circuit architecture as the convention circuit of FIG. 8a, using the two-step switching method of the present invention. According to comparison between FIG. 8a and FIG. 8b, it is obvious that the two-step switching method of the present invention can effectively reduce jitter or noise at output of the loop filter. In an embodiment, the loop filter can be an off-chip loop filter, so as to reduce size of the circuit; however, the present invention is not limited to apply in off-chip circuit, and also can be applied in on-chip circuit upon demand. The difference between the present invention and conventional technology can be observed when the loop filter has different package inductance value.

The present invention disclosed herein has been described by means of specific embodiments. However, numerous modifications, variations and enhancements can be made thereto by those skilled in the art without departing from the spirit and scope of the disclosure set forth in the claims.

What is claimed is:

1. A two-step switching method for a circuit switch, applied to a charge pump circuit of a phase locked loop, wherein a first type switch and a second type switch of opposing types are provided, wherein respective channel lengths and respective channel widths of the first type switch and the second type switch are the same, wherein the first type switch and the second type switch continuously receive an input current, and the two-step switching method comprising:
   in a first step, keeping the input current in a low current state before the first type switch and the second type switch are turned on; and
   in a second step, turning on the first type switch and the second type switch, and gradually adjusting the input current to a target current state to gradually output the input current of the target current state to an external circuit;

wherein keeping the input current in the low current state in the first step and gradually adjusting the input current to the target current state in the second step reduces noise generated in the external circuit; and wherein keeping the input current in the low current state reduces power loss and offsets charge injection.

2. The two-step switching method according to claim 1, wherein the first type switch includes a first drain, a first gate, a first source, and a first channel, and the first channel is electrically connected to the first drain, the first gate, and the first source;

wherein the second type switch includes a second drain, a second gate, a second source, and a second channel, the second channel is electrically connected to the second drain, the second gate, and the second source;

wherein the second drain and the first source are connected to the same node for receiving the input current;

wherein the second source, the first drain, and the external circuit are connected to the same node.

3. The two-step switching method according to claim 1, wherein when the first type switch is a P-type transistor switch, the second type switch is an N-type transistor switch; and wherein when the first type switch is the N-type transistor switch, the second type switch is the P-type transistor switch.

4. The two-step switching method according to claim 3, wherein the N-type transistor switch is turned on when a gate voltage of the N-type transistor switch is adjusted from 0 volt to an operation voltage, and the P-type transistor switch is turned on when a gate voltage of the P-type transistor switch is adjusted from the operation voltage to 0 volt.

5. The two-step switching method according to claim 1, wherein respective gate lengths of the first type switch and the second type switch are the same.

6. The two-step switching method according to claim 1, wherein the input current in the low current state is 0.4 µA, and the input current in the target current state is 20 µA.

7. The two-step switching method according to claim 1, wherein the input current is from a current mirror.

8. The two-step switching method according to claim 1, wherein the external circuit is a loop filter.

9. The two-step switching method according to claim 8, wherein the loop filter is an off-chip loop filter.

* * * * *